US011622487B2

(12) United States Patent
Matsushita

(10) Patent No.: US 11,622,487 B2
(45) Date of Patent: Apr. 4, 2023

(54) COMPONENT SHORTAGE DETECTION DEVICE

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 442 days.

(21) Appl. No.: 16/758,025

(22) PCT Filed: Oct. 31, 2017

(86) PCT No.: PCT/JP2017/039301
§ 371 (c)(1),
(2) Date: Apr. 21, 2020

(87) PCT Pub. No.: WO2019/087289
PCT Pub. Date: May 9, 2019

(65) Prior Publication Data
US 2020/0323114 A1  Oct. 8, 2020

(51) Int. Cl.
*H05K 13/08* (2006.01)
*H05K 13/04* (2006.01)
*G05B 19/416* (2006.01)

(52) U.S. Cl.
CPC ....... *H05K 13/086* (2018.08); *G05B 19/4166* (2013.01); *H05K 13/0419* (2018.08); *G05B 2219/45032* (2013.01)

(58) Field of Classification Search
CPC ...... G05B 19/4166; G05B 2219/45032; H05K 13/0419; H05K 13/086
See application file for complete search history.

(56) References Cited

U.S. PATENT DOCUMENTS

2013/0110464 A1  5/2013  Ishida
2016/0170407 A1  6/2016  Nakazono et al.
(Continued)

FOREIGN PATENT DOCUMENTS

CN      1278999 A     1/2001
CN    101854796 A    10/2010
(Continued)

OTHER PUBLICATIONS

International Search Report issued in PCT/JP2017/039301; dated Jan. 9, 2018.
(Continued)

*Primary Examiner* — Carl J Arbes
(74) *Attorney, Agent, or Firm* — Studebaker & Brackett PC

(57) ABSTRACT

A component shortage detection device detects a component shortage of a tape feeder installed in a component mounting device. The component shortage detection device includes a sensor, configured to detect the tape, and provided at a position that is a midpoint of a tape transportation path of the tape feeder and upstream of a component extraction position by a component mounting head in a tape transportation direction. The component shortage detection device further includes a residual quantity calculation unit configured to calculate a component residual quantity of the tape during a mounting operation; and a determination unit configured to determine whether a component shortage occurs on a basis of output information from the sensor and the component residual quantity when the head fails in extraction of the component.

18 Claims, 14 Drawing Sheets

(56) References Cited

U.S. PATENT DOCUMENTS

| | | |
|---|---|---|
| 2016/0194171 A1 | 7/2016 | Matsumori et al. |
| 2017/0188492 A1 | 6/2017 | Eguchi et al. |
| 2019/0037740 A1 | 1/2019 | Matsumori et al. |
| 2020/0201302 A1 | 6/2020 | Nakazono et al. |

FOREIGN PATENT DOCUMENTS

| | | | |
|---|---|---|---|
| CN | 103096705 A | | 5/2013 |
| CN | 105704996 A | | 6/2016 |
| CN | 105764314 A | | 7/2016 |
| JP | 2004-303819 A | | 10/2004 |
| JP | 2007-299903 A | | 11/2007 |
| JP | 4728278 B | * | 7/2011 |
| JP | 5084557 B | * | 11/2012 |
| JP | 2014-236126 A | | 12/2014 |
| JP | 2015-065381 A | | 4/2015 |
| JP | 2015-103774 A | | 6/2015 |
| JP | 2016-225387 A | | 12/2016 |
| JP | 2017-034170 A | | 2/2017 |
| JP | 2017-118008 A | | 6/2017 |

OTHER PUBLICATIONS

An Office Action issued by the China National Intellectual Property Administration dated Dec. 3, 2020, which corresponds to Chinese Patent Application No. 201780096079.4 and is related to U.S. Appl. No. 16/758,025 with Partial English language translation.

* cited by examiner

COMPONENT SHORTAGE DETECTION DEVICE

CROSS-REFERENCE TO RELATED APPLICATION

This application is a National Stage of International Patent Application No. PCT/JP2017/039301, filed Oct. 31, 2017, the entire content of which is incorporated herein by reference.

BACKGROUND

Technical Field

The present disclosure relates to technology regarding a component mounting device including a tape feeder, and particularly to technology for detecting a component shortage of the tape feeder.

Background Art

Conventionally, a component mounting device including a tape feeder that supplies components using a tape as a carrier has been known. For example, Japanese Patent Application Laid-Open No. 2015-103774 discloses a component mounting device including a splicing-less tape feeder.

The splicing-less tape feeder is a tape feeder that can continuously supply components without joining a new succeeding tape to the rear end of a preceding tape. That is, the splicing-less tape feeder is configured such that, if the tip of the succeeding tape is set at a predetermined position in advance, after components of the preceding tape run out, the succeeding tape is automatically loaded.

Meanwhile, in the tape feeder disclosed in Japanese Patent Application Laid-Open No. 2015-103774, a sensor is provided at a midpoint of a path through which the tape is transported, and on the basis of output information from the sensor, it is determined whether the tape is present, that is, whether a component shortage occurs. Specifically, if a component extraction mistake occurs in a component mounting head, it is checked whether the tape is present on the basis of the output information from the sensor, and if the tape is not present, it is determined that a component shortage occurs.

However, in such a conventional tape feeder, for example, depending on the component housing status in the rear end part of the tape, inconvenience may occur such that a component shortage is erroneously detected as a machine trouble or the component is discarded uselessly.

For example, for a tape having a relatively long area in which no component is housed (empty tape area) in the rear end part, even if the cause of a component extraction mistake is originally a component shortage, if the tape is detected by the sensor when the component extraction mistake occurs, it is not determined that the cause of the component extraction mistake is a component shortage. Therefore, it may be erroneously recognized that the cause of the component extraction mistake is a machine trouble.

If a component extraction mistake occurs from a cause other than a component shortage while the rear end of the tape is positioned between the component extraction position and the sensor, it is determined that the cause is a component shortage even in such a case, and the tape is transmitted (discharged) from the tape feeder and discarded.

Therefore, for a tape on which components are housed to fill the rear end of the tape, the components may be discarded uselessly.

Therefore, in the component mounting device including the splicing-less tape feeder, in order to inhibit the inconvenience described above, it is desired to be able to detect a component shortage more accurately.

SUMMARY

Accordingly, the present disclosure provides a component shortage detection device that can detect a component shortage more accurately without being affected by the component housing status in the tape rear end part.

The present disclosure is a component shortage detection device for detecting a component shortage of a tape feeder installed in a component mounting device. The component shortage detection device includes a sensor provided at a position that is a midpoint of a tape transportation path of the tape feeder and upstream of a component extraction position by a component mounting head in a tape transportation direction, the sensor being configured to detect the tape; a residual quantity calculation unit configured to calculate a component residual quantity of the tape during a mounting operation; and a determination unit configured to determine whether the component shortage occurs on a basis of output information from the sensor and the component residual quantity when the head fails in extraction of the component.

DETAILED DESCRIPTION

A preferred embodiment of the present disclosure will be described in detail below with reference to the accompanying drawings.

[1. Configuration of Component Mounting Device]

Figure 1:
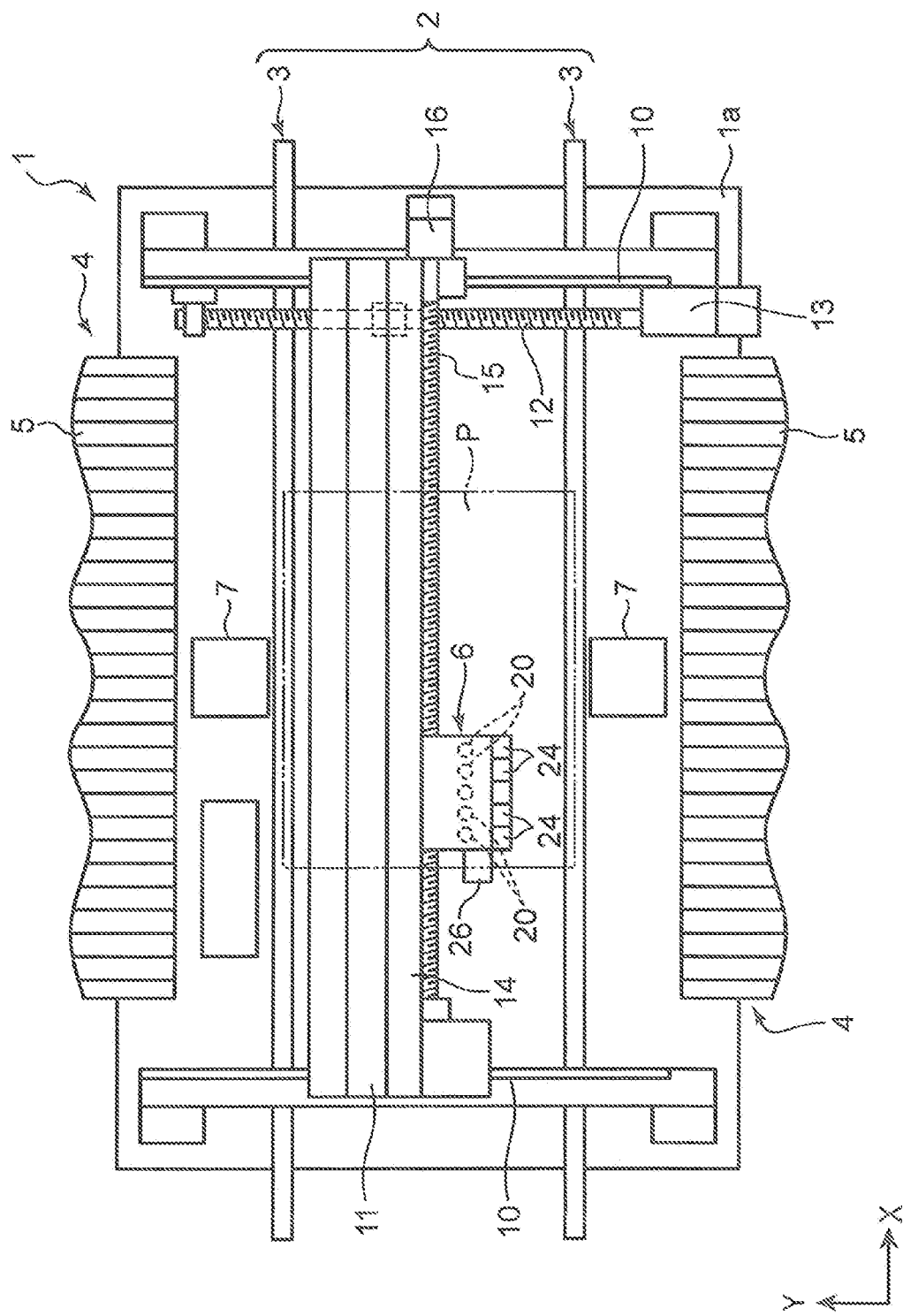
FIG. 1 is a plan view of a component mounting device to which a component shortage detection device according to the present disclosure is applied.

FIG. 1 is a plan view showing a component mounting device to which a component shortage detection device according to the present disclosure is applied. Note that XYZ rectangular coordinate axes are shown in the drawing in order to clarify the directional relationship. The X direction is a direction parallel to the horizontal plane. The Y direction is a direction orthogonal to the X direction on the horizontal plane. The Z direction is a direction orthogonal to both the X and Y directions, that is, the vertical direction.

The component mounting device 1 includes a base 1a that is rectangular in plan view, a substrate transportation mechanism 2 that transports a substrate P such as a printed wiring board on the base 1a, component supply units 4, a head unit 6, and a head unit driving mechanism that drives the head unit 6.

The substrate transportation mechanism 2 includes a pair of conveyors 3 that transport the substrate P in the X direction, and a positioning mechanism (not shown) that positions the substrate P transported by the conveyors 3. The conveyors 3 are so-called belt conveyors. The conveyors 3 receive the substrate P from one side (right side of FIG. 1), transport the substrate P to a predetermined mounting work position (position of the substrate P shown in FIG. 1), and carry out the substrate P to the other side (left side of FIG. 1) after the mounting work. The positioning mechanism lifts the substrate P from the conveyors 3 and positions the substrate P at the mounting work position.

The component supply units 4 are provided on both sides of the substrate transportation mechanism 2 (both sides in the Y direction). In this example, each component supply unit 4 is integrated into the base 1a.

A plurality of tape feeders 5 is detachably disposed along the conveyors 3 in each component supply unit 4. The tape feeders 5 use a tape as a carrier to supply small-piece electronic components such as ICs, transistors, and capacitors (hereinafter simply referred to as components).

The head unit 6 extracts the component from each tape feeder 5 of the component supply unit 4 and mounts the component on the substrate P, and moves in the X direction and the Y direction in a certain area by the operation of the head unit driving mechanism. That is, the head unit driving mechanism includes a unit support member 11 movable in the Y direction along a fixed rail 10 fixed to an elevated frame, a Y-axis servo motor 13 that drives the unit support member 11 via a ball screw shaft 12, a fixed rail 14 that movably supports the head unit 6 in the X direction with respect to the unit support member 11, and an X-axis servo motor 16 that drives the head unit 6 via a ball screw shaft 15. Note that the head unit driving mechanism may be configured to directly drive the unit support member 11 or the head unit 6 by using a linear motor as a drive source.

The head unit 6 includes a total of five component mounting heads 20 arranged in a line in the X direction, and a head driving mechanism that drives the heads 20.

The head driving mechanism includes Z-axis servo motors 24 corresponding to respective heads 20, a raising and lowering driving mechanism that individually raises and lowers each head 20 (moves in the Z direction), one R-axis servo motor 25 common to respective heads 20 (shown in FIG. 7), and a rotation driving mechanism that simultaneously rotates each head 20 about the head center axis (R direction).

The tip of each head 20 is provided with a nozzle for component suction. Each nozzle communicates with a negative pressure generation device (not shown) via a negative pressure supply path including a switching valve 27 (shown in FIG. 7). When negative pressure is supplied from the negative pressure generation device to the nozzle tip, each nozzle sucks the component. Note that the negative pressure supply path is provided with a pressure sensor 28 (shown in FIG. 7) that detects pressure in the path and outputs the pressure to a control device 70 described later. As will be described later, the control device 70 determines success or failure of component suction (component extraction) by each head 20 on the basis of output information from the pressure sensor 28 (pressure information).

The head unit 6 further includes a substrate recognition camera 26. The substrate recognition camera 26 moves together with the head unit 6 and captures images of various marks written on an upper surface of the substrate P from above in order to identify and position the substrate P.

As shown in FIG. 1, the component recognition cameras 7 are each disposed at positions between the respective component supply units 4 and the substrate transportation mechanism 2 on the base 1a. Each component recognition camera 7 captures images of the component from below in order to recognize the suction state of the component taken out from the tape feeder 5 by the head 20.

A component mounting operation of the component mounting device 1 is as follows. To begin with, the head unit 6 moves onto the component supply unit 4, and each head 20 extracts the component from the tape feeder 5. Thereafter, when the head unit 6 passes over the nearest component recognition camera 7, the component sucked by each head 20 is captured by the component recognition camera 7, and the suction state of the component is recognized. Then, the head unit 6 moves onto the substrate P, and the component sucked by each head 20 is sequentially mounted on the substrate P. At this time, the position of the head unit 6 and the rotation angle or the like of the head 20 are controlled according to component recognition results, whereby the component is appropriately mounted at each mounting point on the substrate P. Thus, one cycle of the mounting operation is finished, and this operation is repeated as necessary, whereby a required number of components are mounted on the substrate P.

[2. Overall Configuration of Tape Feeder 5]

Figure 2:
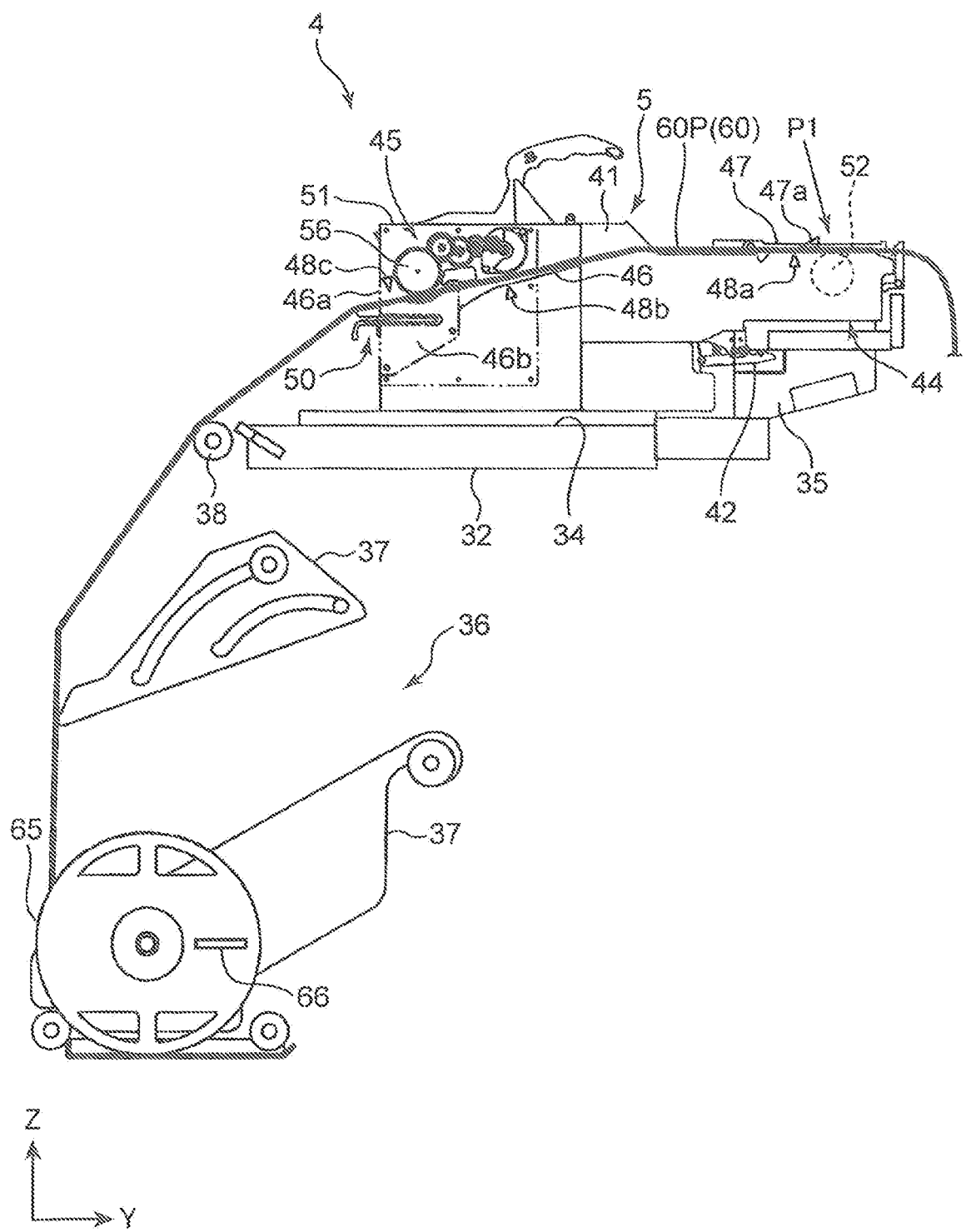
FIG. 2 is a side view of a component supply unit and a tape feeder.

FIG. 2 is an overall schematic view of the component supply unit 4 and the tape feeder 5 in side view. Note that in the following description of the tape feeder 5 and the component supply unit 4, for convenience, the side near the substrate transportation mechanism 2 (right side in FIG. 2) is referred to as "front", and the opposite side is referred to as "rear."

The tape feeder 5 is attached to a feeder attachment unit 32 provided in the component supply unit 4. In more detail, the component supply unit 4 includes the feeder attachment unit 32 and a reel support unit 36. The feeder attachment unit 32 is provided with a plurality of slots 34 arranged in parallel with each other at regular intervals in the X direction and extending in the Y direction, and a fixing table 35 extending in the X direction at a position forward of the slots 34. Then, in a state where the tape feeder 5 is set in each slot 34, each tape feeder 5 is fixed to the fixing table 35 by a clamp mechanism 42. Thus, the plurality of tape feeders 5 is arranged in parallel line in the component supply unit 4.

In the reel support unit 36, a reel 65 around which a component supply tape 60 is wound is supported correspondingly to each slot 34, and the component supply tape 60 is drawn out from the reel 65 to the tape feeder 5. The reel support unit 36 is positioned on the rear lower side of the feeder attachment unit 32. Reel holders 37 that rotatably support the reel 65 correspondingly to each slot 34 are provided in upper and lower two layers. Note that reference numeral 38 in FIG. 2 is a guide roller for guiding the component supply tape 60 drawn out from the reel 65 to the tape feeder 5, and is provided at a rear end of the feeder attachment unit 32 correspondingly to each slot 34.

The tape feeder 5 includes a feeder body 41 that is elongated in the front-rear direction (Y direction) and the clamp mechanism 42 provided on the front lower side. The tape feeder 5 is fixed to the fixing table 35 by the clamp mechanism 42 with the feeder body 41 inserted (set) in the slot 34.

The tape feeder 5 further includes a front transmitting unit 44 provided in a front end part of the feeder body 41, a rear transmitting unit 45 provided in a rear end part of the feeder body 41, a tape transportation path 46 provided in the feeder body 41, a tape guide 47, first to third tape detection sensors 48*a*, 48*b*, and 48*c*, a feeder control unit 49 (see FIG. 7), a tape support member 50 detachably fixed to the rear end of the feeder body 41, and an operation unit 51 disposed on a rear upper surface of the feeder body 41.

The tape transportation path 46 is a path through which the component supply tape 60 is guided. The tape transportation path 46 extends obliquely upward from the rear end toward the front upper portion of the feeder body 41.

Figure 3:
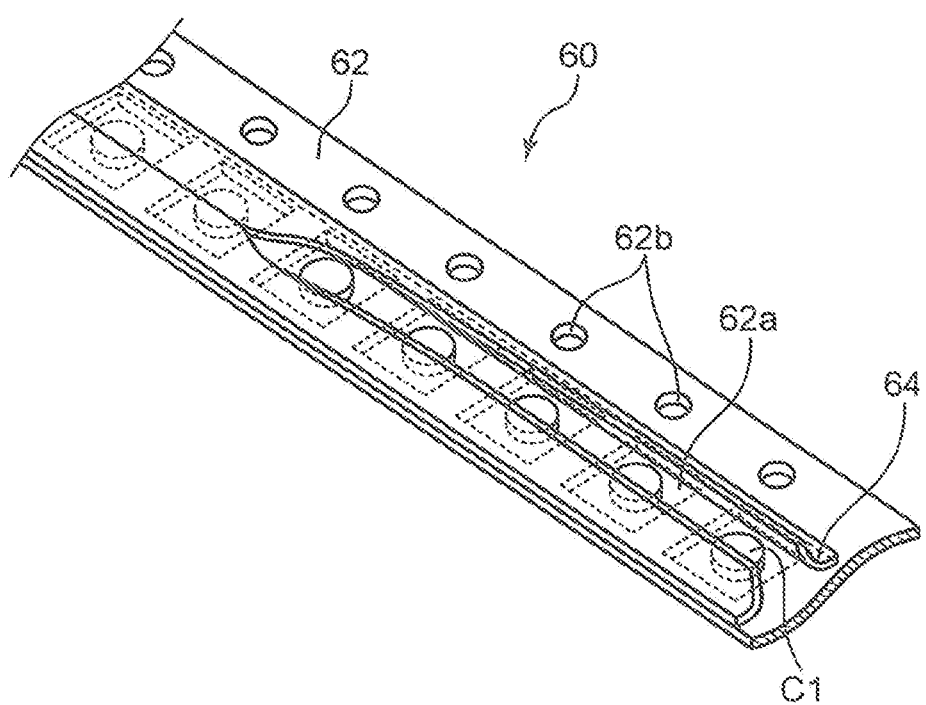
FIG. 3 is a perspective view of a component supply tape.

The component supply tape 60 is a long medium for component supply including a tape body 62 and a cover tape 64 as shown in FIG. 3. In the tape body 62, a large number of component housing parts 62*a* (recessed parts) opened upward are formed at regular intervals in the longitudinal direction, and a component (C1) is housed in each component housing part 62*a*. The cover tape 64 is bonded to the upper surface of the tape body 62, whereby each component housing part 62*a* is closed by the cover tape 64. In addition, a plurality of engagement holes 62*b* that is arranged at regular intervals in the longitudinal direction and penetrates the tape body 62 in the thickness direction is provided on the side of the component housing parts 62*a* in the tape body 62.

Note that in the following description, the component supply tape 60 is simply referred to as a tape 60 for convenience. The tape 60 is wound around the reel 65 as shown in FIG. 2. The reel 65 is rotatably supported by the reel holder 37. The tape 60 is drawn out from the reel 65 and guided to the front upper surface of the feeder body 41 through the tape transportation path 46.

The tape guide 47 is provided on the front upper surface of the feeder body 41. The tape guide 47 covers from above the tape 60 moving through the tape transportation path 46 on the front upper surface of the feeder body 41. The tape guide 47 guides the tape 60 substantially horizontally along the upper surface of the feeder body 41 to a component extraction position P1. The component extraction position P1 is a position where the component (C1) is extracted by the head 20, and is set at a position near the front end of the upper surface of the feeder body 41.

In the tape guide 47, an opening (not shown) is provided at a position corresponding to the component extraction position P1, and a cutting mechanism 47*a* for cutting the cover tape 64 is further provided at a position rearward of the opening. The cutting mechanism 47*a* is configured to fold back the cover tape 64 outward while cutting the cover tape 64 along the longitudinal direction at the center of the width direction (see FIG. 3). With this configuration, the component (C1) housed in the component housing part 62*a* is exposed at the component extraction position P1 to allow the head 20 to suck the component.

The front transmitting unit 44 includes a front sprocket 52 disposed below the tape guide 47, and a driving mechanism that drives the sprocket 52 to rotate by using a front motor 53 (see FIG. 7) as a drive source. The front sprocket 52 includes teeth that engage with the engagement holes 62*b* of the tape 60 guided along the tape transportation path 46. That is, the front transmitting unit 44 transmits the tape 60 toward the component extraction position P1 by driving the front sprocket 52 to rotate by the front motor 53.

The rear transmitting unit 45 includes a rear sprocket 56 disposed in the rear end of the feeder body 41, and a driving mechanism that drives the sprocket 56 to rotate by using a rear motor 57 (see FIG. 7) as a drive source. The rear sprocket 56 faces the tape transportation path 46 from above, and includes teeth that engage with the engagement holes 62*b* of the component supply tape 60 guided along the tape transportation path 46. That is, the rear transmitting unit 45 transmits the tape 60 forward (toward the component extraction position P1) by driving the rear sprocket 56 to rotate by the rear motor 57.

The tape 60 is transmitted toward the component extraction position P1 by respective transmitting units 44 and 45, and the component is extracted at the component extraction position P1 through the opening of the tape guide 47. Note that a tape collection container (not shown) is disposed forward of the reel support unit 36. The tape 60 from which the component (C1) has been taken out is shredded by a cutter (not shown) and collected in the tape collection container while being transmitted downward from the front end of the feeder body 41.

The tape support member 50 partitions the rear end part of the tape transportation path 46 into upper and lower two paths (upper path 46*a* and lower path 46*b*), and supports the tape 60 passing through the upper path 46*a* from below. In more detail, the rear end part of the tape transportation path 46 has a shape expanding vertically from the front to the rear. The tape support member 50 is inserted into the tape transportation path 46 from behind the feeder body 41, and is detachably fixed to the feeder body 41. With this configuration, the rear end part of the tape transportation path 46 is partitioned by the tape support member 50 into the upper path 46*a* and the lower path 46*b*.

The rear sprocket 56 faces the upper path 46*a*, and is engaged with the engagement holes 62*b* of the tape 60 passing through the upper path 46*a*. Note that the tape support member 50 includes a support piece that can be elastically displaced in the vertical direction. The tape 60 passing through the upper path 46*a* is pressed against the rear sprocket 56 by the support piece.

The first tape detection sensor 48*a*, the second tape detection sensor 48*b*, and the third tape detection sensor 48*c* each detect the tape 60 moving along the tape transportation path 46. The tape detection sensors 48*a*, 48*b*, and 48*c* are disposed in this order rearward of the component extraction position P1 in the tape transportation path 46, that is, upstream in the transportation direction of the tape 60.

The first tape detection sensor 48*a* is disposed at a position immediately rearward of the cutting mechanism 47*a*. The third tape detection sensor 48*c* is disposed at the rear end of the feeder body 41 and above the upper path 46*a*. With this configuration, the third tape detection sensor 48*c* detects the tape 60 inserted into the upper path 46*a*. The second tape detection sensor 48*b* is disposed between the first tape detection sensor 48*a* and the third tape detection sensor 48*c*, specifically, at a position immediately forward of the junction of the upper path 46*a* and the lower path 46*b* (on the right side in FIG. 2).

The operation unit 51 is provided mainly for an operator to perform transmission and reverse transmission of the tape 60. The operation unit 51 includes an operation button 51*a* for tape transmission and tape reverse transmission, and an LED display unit 51*b* (see FIG. 7) indicating an operation state of the tape feeder 5 and the like.

The feeder control unit 49 controls the drive of the tape feeder 5. The feeder control unit 49 controls the drive of the front motor 53 and the rear motor 57 in response to the operation of the operation button 51*a*. Also, the feeder control unit 49 controls the LED display unit 51*b* to notify the operation state of the tape feeder 5 and the like. Although not shown, the feeder attachment unit 32 includes a connector for electrically connecting each tape feeder 5 to the control device 70 described later of the component mounting device 1. The feeder control unit 49 is electrically connected to the control device 70 via the connector or the like. That is, the feeder control unit 49 controls the drive of the tape feeder 5 in response to the operation of the operation unit 51, and controls the drive of the tape feeder 5 in response to input of a control signal from the control device 70. Note that output information (signal) from respective tape detection sensors 48*a* to 48*c* is input to the control device 70 via the feeder control unit 49. As will be described later, the control device 70 performs processing such as component shortage determination of the tape feeder 5 on the basis of the output information (signal) from respective tape detection sensors 48*a* to 48*c*. Note that in this example, the second tape detection sensor 48*b* corresponds to "sensor" of the present disclosure.

[3. Method of Installing Tape 60 and Operation of Tape Feeder 5]

The tape feeder 5 is a so-called splicing-less tape feeder. The tape feeder 5 is configured such that, if the tape 60 for component replenishment is set in advance in the upper path 46*a*, after the tape 60 previously installed in the tape feeder 5 is all transmitted (discharged), the succeeding tape 60 is automatically loaded at the component extraction position P1.

The method of installing the tape 60 in the tape feeder 5 is as follows.

To begin with, the reel 65 is attached to the lower-layer reel holder 37 of the reel support unit 36. At this time, a bar code 66 affixed on the reel 65 is read in advance with a bar code reader 84 described later. The bar code 66 is a code in which ID, name, type, production lot, initial number of components, and other various information items regarding the component housed in the tape 60 wound around the reel 65 are encoded and recoded. By reading the bar code 66 with the bar code reader 84 in this manner, the position of the tape feeder 5 (slot 34) is compared with the component by the control device 70, and the various information items of the component supply tape 60 (reel 65) installed in the tape feeder 5 are stored in the control device 70.

Next, the component supply tape 60 is drawn out from the reel 65, and the tip of the component supply tape 60 is inserted into the upper path 46*a* from behind the feeder body 41. With this operation, the tip of the component supply tape 60 is engaged with the rear sprocket 56, and the tip is supported by the tape support member 50 to prevent the tip from coming off the teeth of the sprocket 56.

Next, the operation button 51*a* (tape transmission button) is pressed and operated to load the tape 60. Specifically, the tape 60 is transmitted to the position where the tip of the tape 60 is engaged with the front sprocket 52. With this operation, the installation of the tape 60 in the tape feeder 5 is completed.

During the component mounting work, the drive of the front motor 53 is controlled by the feeder control unit 49 on the basis of the control signal output from the control device 70. With this control, the tape 60 is intermittently transmitted as the head 20 takes out the component. Note that the rear motor 57 stops in principle except when the tape 60 is loaded. Therefore, the rear sprocket 56 is configured to be able to idle only in one direction when the tape 60 is transmitted for component supply.

Figure 4:
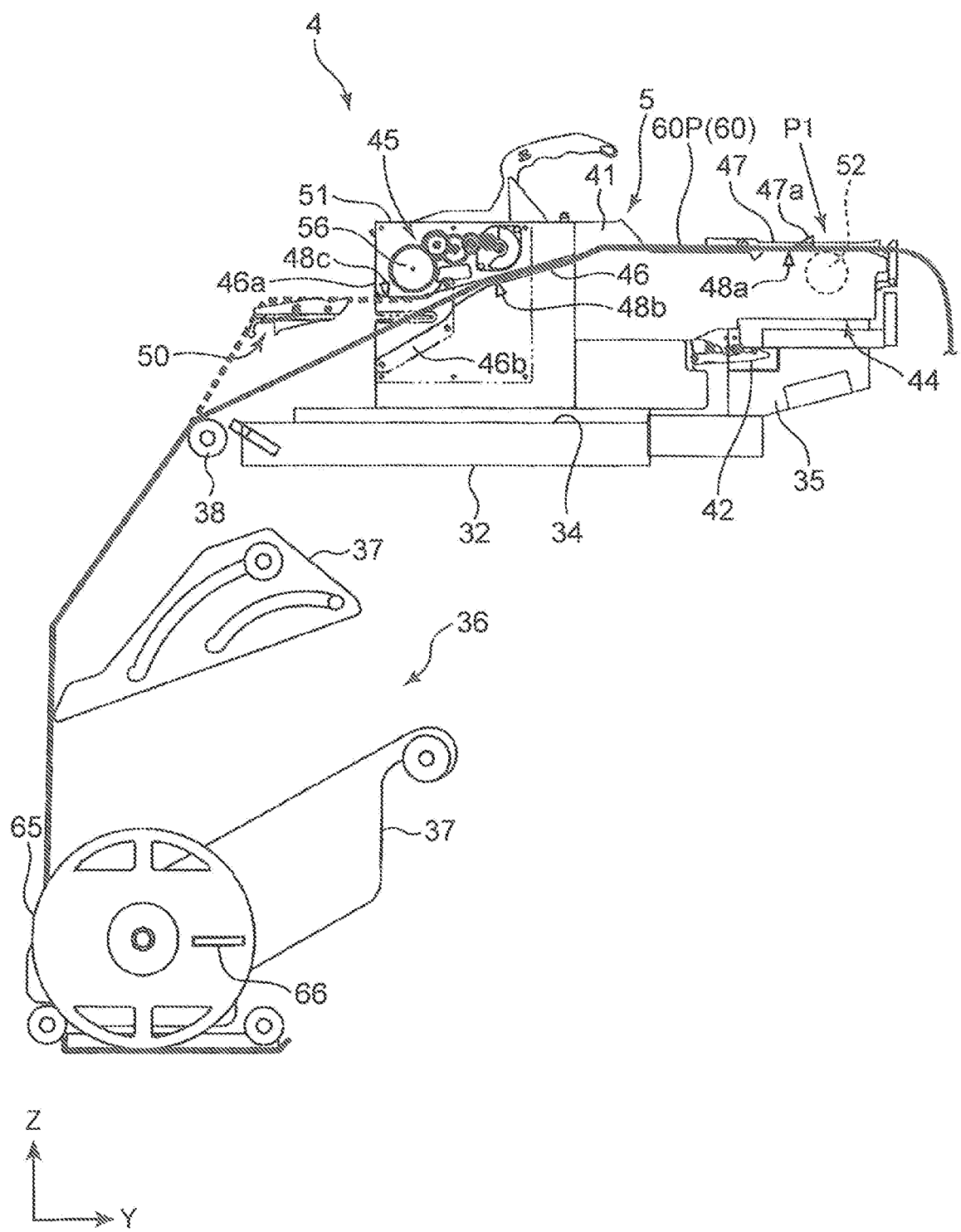
FIG. 4 is a diagram illustrating a procedure for setting a succeeding component supply tape in the tape feeder.
Figure 5:
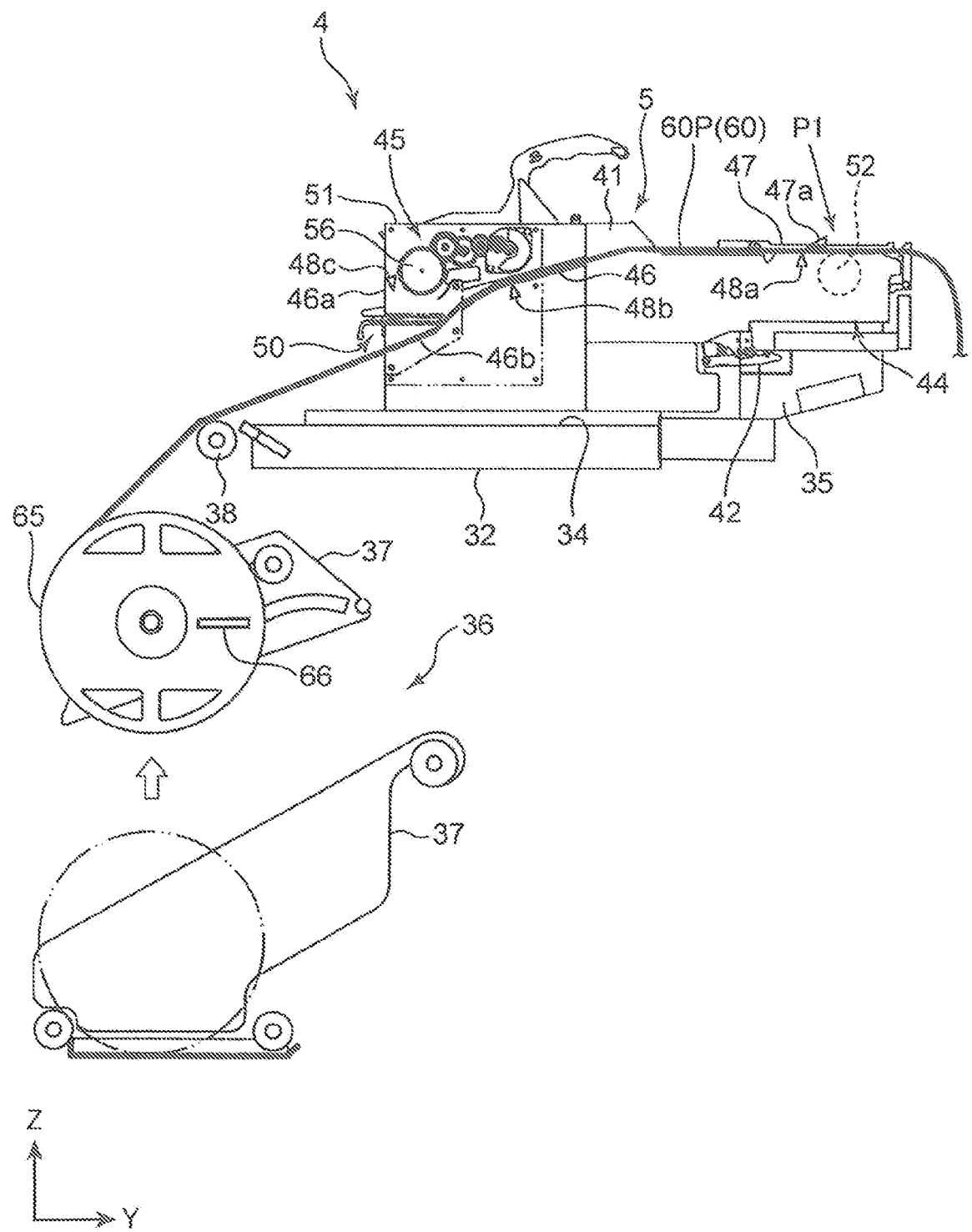
FIG. 5 is a diagram illustrating the procedure for setting the succeeding component supply tape in the tape feeder.
Figure 6:
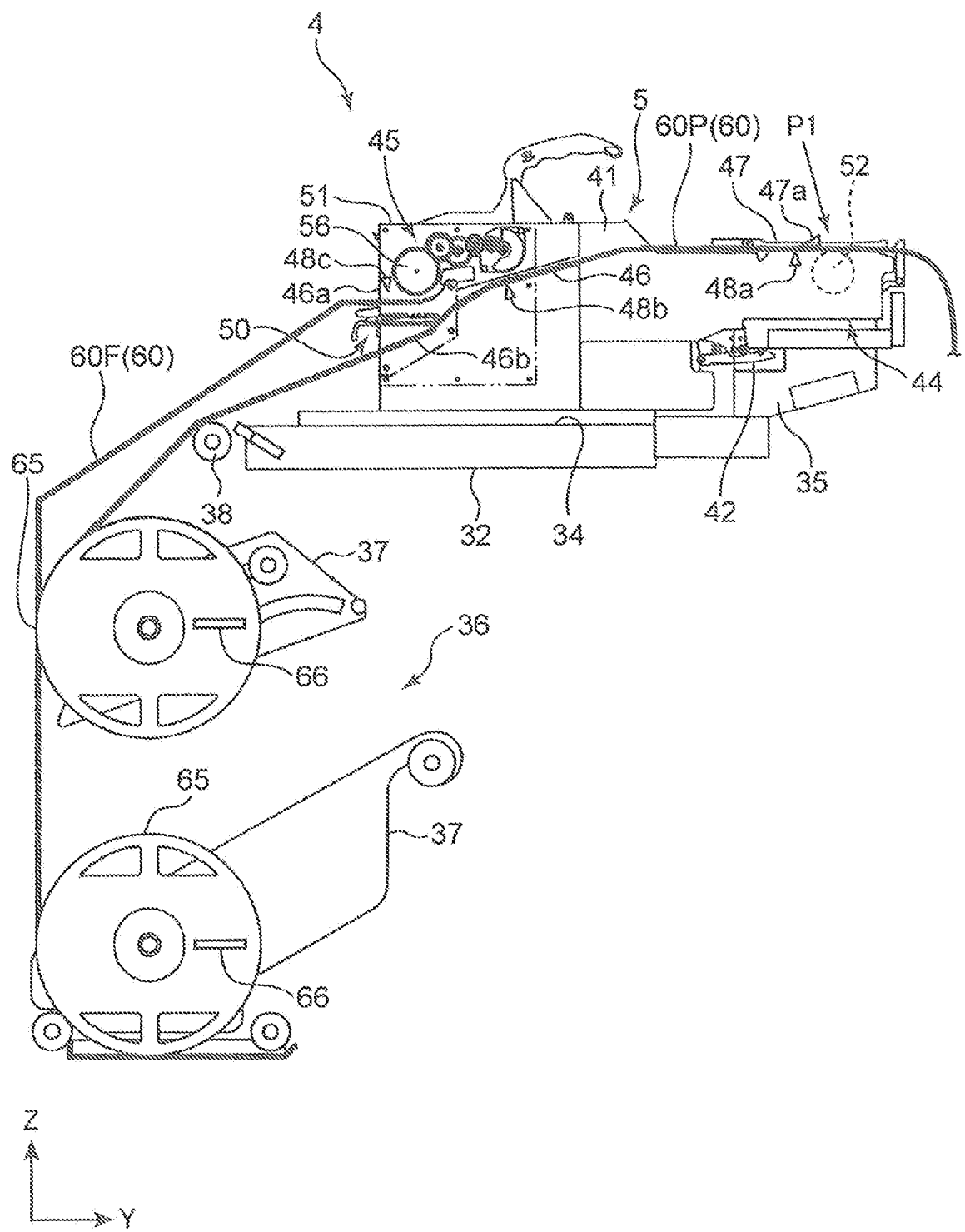
FIG. 6 is a diagram illustrating the procedure for setting the succeeding component supply tape in the tape feeder.

The method of installing the preceding tape 60 in the tape feeder 5 has been described above. The method of installing the succeeding tape 60 is as shown in FIGS. 4 to 6. Note that in the following description, the preceding tape 60 may be referred to as a "preceding tape 60P" and the succeeding tape 60 may be referred to as a "succeeding tape 60F" for discriminating the tape.

When installing the succeeding tape 60F, to begin with, the tape support member 50 is removed from the feeder body 41, and as shown in FIG. 4, the preceding tape 60P is moved by its own weight from the upper path 46*a* to the lower path 46*b*. With this operation, the engagement of the preceding tape 60P with the rear sprocket 56 is released.

Next, the tape support member 50 is installed in the feeder body 41, and as shown in FIG. 5, the reel 65 around which the preceding tape 60P is wound is moved from the lower-layer reel holder 37 to the upper-layer reel holder 37.

Thereafter, as shown in FIG. 6, the reel 65 around which the succeeding tape 60F is wound is attached to the lower-layer reel holder 37, the succeeding tape 60F is drawn out from the reel 65, and the tip is inserted into the upper path 46*a*. With this operation, the tip of the succeeding tape 60F is engaged with the rear sprocket 56, and the tip is supported by the support piece 50*a*. Thus, the installation of the succeeding tape 60F in the tape feeder 5 is completed.

In this way, when setting the succeeding tape 60F as well, the bar code 66 of the reel 65 is read with the bar code reader 84, in a similar manner to the preceding tape 60P. With this operation, the position of the tape feeder 5 (slot 34) is compared with the component by the control device 70, and the various information items of the succeeding tape 60F (reel 65) installed in the tape feeder 5 are stored in the control device 70.

Note that when the component of the preceding tape 60P is all removed during the component mounting work, the front motor 53 is driven, and the preceding tape 60P is transmitted (discharged) from the tape feeder 5 and collected in the tape collection container. Then, when the preceding tape 60P is discharged, specifically, when the first tape detection sensor 48*a* and the second tape detection sensor 48*b* are both turned off (when the preceding tape 60P is no longer detected), in synchronization with this, the rear motor 57 is driven, and the succeeding tape 60F is loaded at the component extraction position P1. With this operation, the transition from the preceding tape 60P to the succeeding tape 60F is automatically performed.

From here on, according to the procedure as described above, if the succeeding tape 60F is installed in advance in the tape feeder 5 before the preceding tape 60P has a component shortage, the component will be supplied by the tape feeder 5 continuously without interruption.

[Control System of Component Mounting Device 1]

Next, a control system of the component mounting device 1 will be described with reference to FIG. 7.

Figure 7:
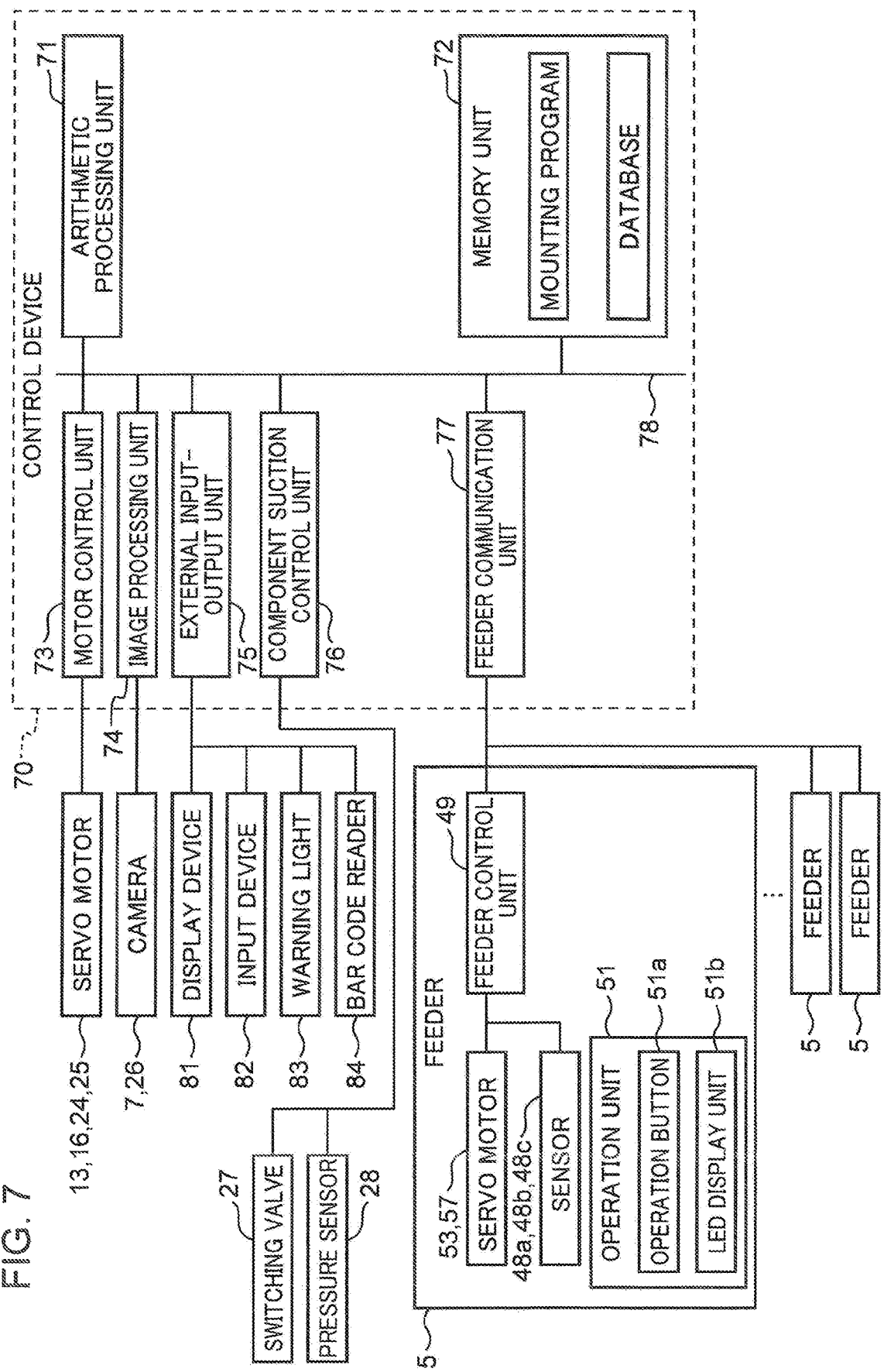
FIG. 7 is a block diagram showing a control system of the component mounting device.

The component mounting device 1 includes the control device 70 as shown in FIG. 7. The control device 70 includes an arithmetic processing unit 71 that comprehensively controls the operation of the component mounting device 1, a memory unit 72 in which a mounting program or the like is stored, a motor control unit 73 that controls the drive of the servo motors 13, 16, 24, 25 of the X, Y, Z and R axes, respectively, an image processing unit 74 that performs predetermined processing on image data output from the component recognition camera 7 and the substrate recognition camera 26, an external input-output unit 75, a component suction control unit 76 that controls a component suction operation by the head 20, and a feeder communication unit 77.

The arithmetic processing unit 71 is a computer including a CPU and a memory, and is connected to the memory unit 72, the motor control unit 73, the image processing unit 74, the external input-output unit 75, the component suction control unit 76, and the feeder communication unit 77 via a bus 78.

The arithmetic processing unit 71 performs predetermined component mounting processing on the basis of the mounting program, and performs various arithmetic processes and various determination processes associated therewith. Also, the arithmetic processing unit 71 performs component shortage determination processing for monitoring the component residual quantity of the tape 60 (reel 65) set in each tape feeder 5 and detecting a component shortage on the basis of the output information from the second tape detection sensor 48b and the component residual quantity. The component shortage determination processing will be described in detail later.

The memory unit 72 stores the mounting program and each database that records data necessary for executing the mounting program.

The database stores component data including component comparison data in which the position of the tape feeder 5 (slot 34) in the feeder attachment unit 32 is associated with the component to be placed at the position (component ID), and various information items of the component housed in the tape 60 installed in each tape feeder 5 (slot 34). Specifically, the component data includes component ID, name, type, production lot, initial number of components, component residual quantity, and other various information items regarding the component, and is stored in the memory unit 72 mainly by reading the bar code 66 with the bar code reader 84 described above.

Note that "the initial number of components" is the initial (at the time of arrival) number of components housed in the tape 60 (reel 65) before use. "The component residual quantity" is the current number of components obtained by subtracting the number of components consumed as the mounting operation progresses from the initial number of components. "The component residual quantity" is sequentially calculated by the arithmetic processing unit 71 during the mounting operation, and is updated and stored in the memory unit 72. Also, the component data includes a "threshold" for component shortage determination. The default value of the "threshold" is "0", and the operator can arbitrarily change the threshold in units of tape 60 (reel 65) by operating an input device 82 described later.

The feeder communication unit 77 is an interface dedicated to the feeder in the control device 70. The tape feeders 5 disposed in the component supply unit 4 are all connected to the feeder communication unit 77 via the connector of the fixing table 35.

The external input-output unit 75 is an interface for devices other than the tape feeder. Devices including a display device 81 such as a liquid crystal display device for displaying various information items, an input device 82 such as a keyboard and a mouse, a warning light 83 for notifying the operator of an abnormality that occurs in the component mounting device 1 or the tape feeder 5, the bar code reader 84, and the like are connected to the external input-output unit 75.

The bar code reader 84 reads the bar code 66 that is a recording medium affixed on the reel 65 around which the tape 60 is wound. As already described, the bar code 66 is a code in which ID, name, type, production lot, initial number of components, and other various information items regarding the component housed in the tape 60 are encoded and recoded. The bar code 66 is affixed, for example, on a side surface of the reel.

Note that in this example, the arithmetic processing unit 71 corresponds to "residual quantity calculation unit" and "determination unit" of the present disclosure, and the input device 82 corresponds to "first setting unit" and "second setting unit." In this example, the arithmetic processing unit 71, the second tape detection sensor 48b of the tape feeder 5, and the like constitute the component shortage detection device of the present disclosure.

[4. Component Shortage Determination Processing]

Figure 8:
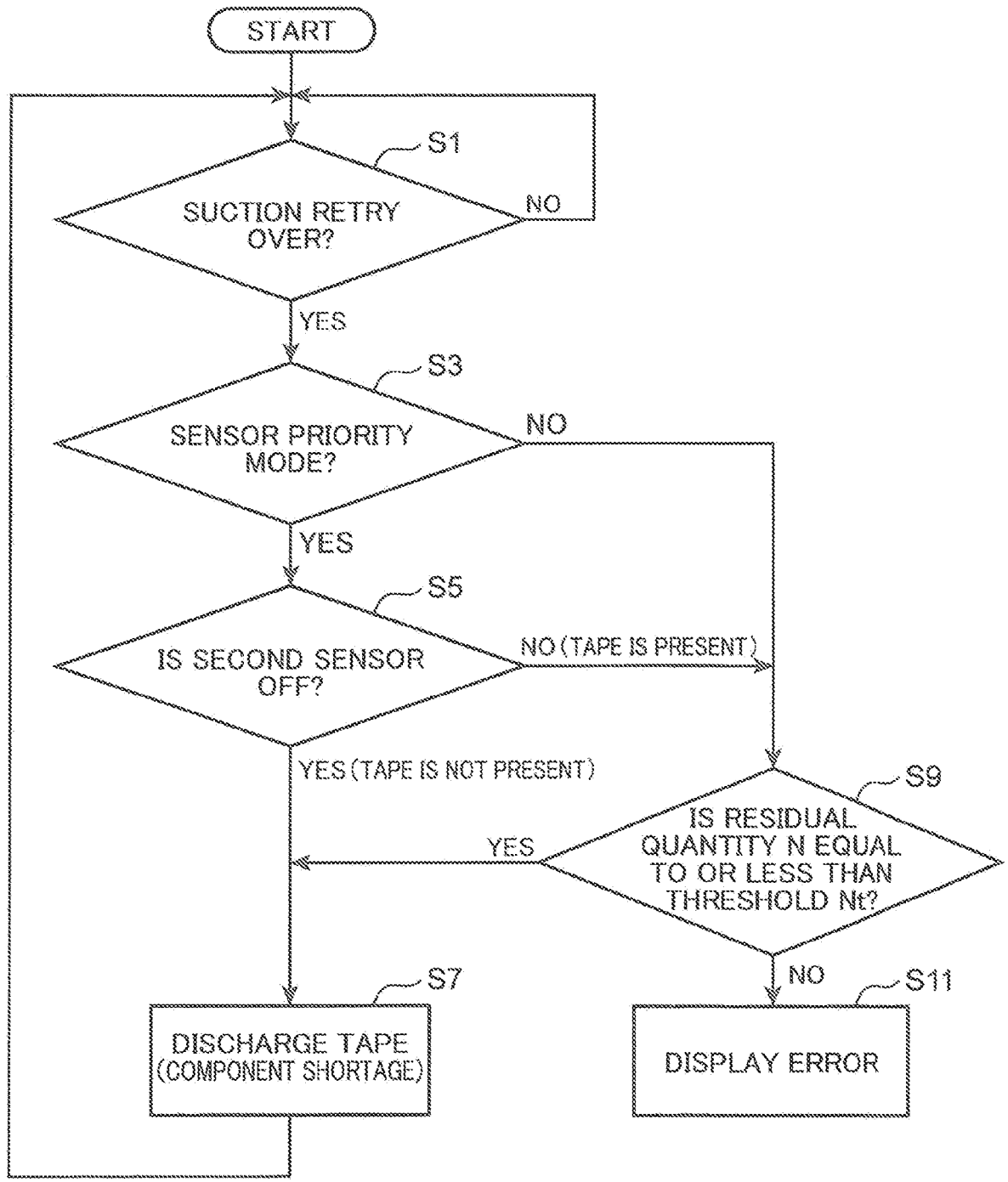
FIG. 8 is a flowchart showing control of component shortage detection processing.

FIG. 8 is a flowchart showing component shortage determination processing. The component shortage determination processing refers to processing for detecting that the tape 60 (preceding tape 60P) set in the tape feeder 5 has a component shortage. The component shortage determination processing is continuously performed for each tape feeder 5 set in the component supply unit 4, for example, from the time when the component mounting device 1 is activated.

When the component shortage determination processing starts, the arithmetic processing unit 71 determines whether suction retry over has occurred in the head 20 (step S1). The suction retry over means that when the head 20 extracts the component from the tape feeder 5, the head 20 fails in suction of the component successively for a preset number of times. In this example, when the component suction fails three times, that is, when the component is not sucked by the head 20 even after a series of operations of transmitting the tape 60 and sucking the component by the head 20 is performed three times, the arithmetic processing unit 71 determines that the suction retry over has occurred.

Note that the determination as to whether the head 20 has failed in the component suction is made on the basis of pressure information obtained from the pressure sensor 28. Specifically, if the detected pressure value of the pressure sensor 28 does not become equal to or less than the threshold within a certain time after the component suction operation is performed by the head 20 (nozzle), that is, when the pressure in the negative pressure supply path does not reach the negative pressure value defined by the threshold, the arithmetic processing unit 71 determines that the head 20 has failed in the component suction.

When Yes in step S1 (when it is determined that the suction retry over has occurred), the arithmetic processing unit 71 determines whether a "sensor priority mode" has been set as the setting mode of the component shortage determination processing (step S3).

Here, the mode of the component shortage determination processing is a condition for the component shortage determination. The component mounting device 1 makes it possible to select and set in advance one of two modes of "sensor priority mode" and "component residual quantity priority mode." The mode setting can be performed by the operator operating the input device 82 while viewing the display device 81. Note that the "sensor priority mode" is a mode for performing the component shortage determination processing by preferentially referring to the output information from the second tape detection sensor 48b of the tape feeder 5. The "component residual quantity priority mode" is a mode for performing the component shortage determination processing by referring to only the component residual quantity stored as the component data.

When Yes in step S3, that is, when the setting mode of the component shortage determination processing is the "sensor priority mode", the arithmetic processing unit 71 determines whether the second tape detection sensor 48b is off, that is, whether the tape 60 is present at the position of the second tape detection sensor 48b (step S5). Here, when it is determined Yes (when it is determined that the tape 60 is not present), the arithmetic processing unit 71 determines that the tape 60 has a component shortage, and drives the front sprocket 52 to transmit the tape 60 from the tape feeder 5 (step S7). Thereafter, the process returns to step S1.

On the other hand, when it is determined No in step S5 (when it is determined that the tape 60 is present), the arithmetic processing unit 71 takes the component residual quantity of the tape 60 stored as the component data into consideration and determines whether the component residual quantity (N) is equal to or less than a preset threshold (Nt) (step S9). Here, when Yes, the arithmetic processing unit 71 shifts the process to step S7 and discharges the tape 60 from the tape feeder 5. On the other hand, when No, the arithmetic processing unit 71 determines that the component remains in the component supply tape 60, that is, determines that "suction retry over" in step S1 is caused by a machine trouble, and controls the display device 81 to display an error and activates the warning light 83 (step S11).

Note that when No in step S3, that is, when the setting mode of the component shortage determination processing is the "component residual quantity priority mode", the arithmetic processing unit 71 immediately takes the component residual quantity of the tape 60 stored as the component data into consideration without taking the output information from the second tape detection sensor 48b into consideration, and determines whether the component residual quantity (N) is equal to or less than the preset threshold (Nt).

The above component shortage determination processing is briefly summarized as follows.

In a case where the "sensor priority mode" is set as the setting mode of the component shortage determination processing, when the suction retry over occurs in the head 20, it is determined that a component shortage occurs if the second tape detection sensor 48b is off. On the other hand, in a case where the second tape detection sensor 48b is on, it is determined that a component shortage occurs if the component residual quantity (N) is equal to or less than the threshold (Nt).

Meanwhile, in a case where the "component residual quantity priority mode" is set as the setting mode of the component shortage determination processing, when the suction retry over occurs in the head 20, it is determined that a component shortage occurs if the component residual quantity (N) is equal to or less than the threshold (Nt).

[5. Operational Effects]

The component mounting device 1 as described above determines whether a component shortage occurs on the basis of the output information from the second tape detection sensor 48b and the component residual quantity of the tape 60. Therefore, the component mounting device 1 can more accurately detect the component shortage without being affected by the housing status of the component in the rear end part of the tape 60.

Figure 9A:
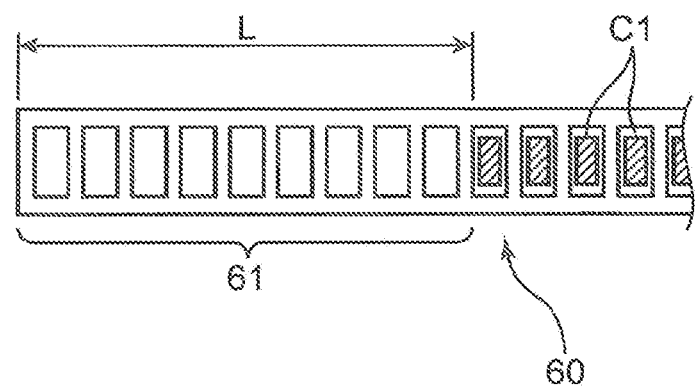
FIG. 9A is a plan view showing a rear end part of the component supply tape having an empty tape area in a tape rear end.
Figure 9B:
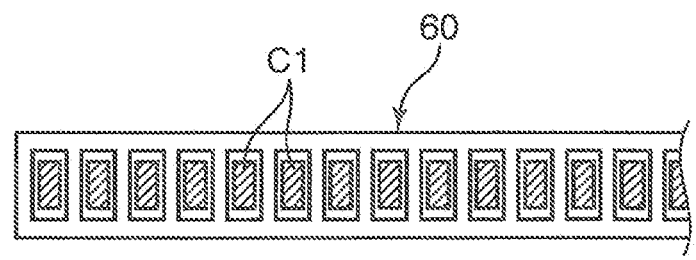
FIG. 9B is a plan view showing the rear end part of the component supply tape in which components are housed to fill the tape rear end.
Figure 10:
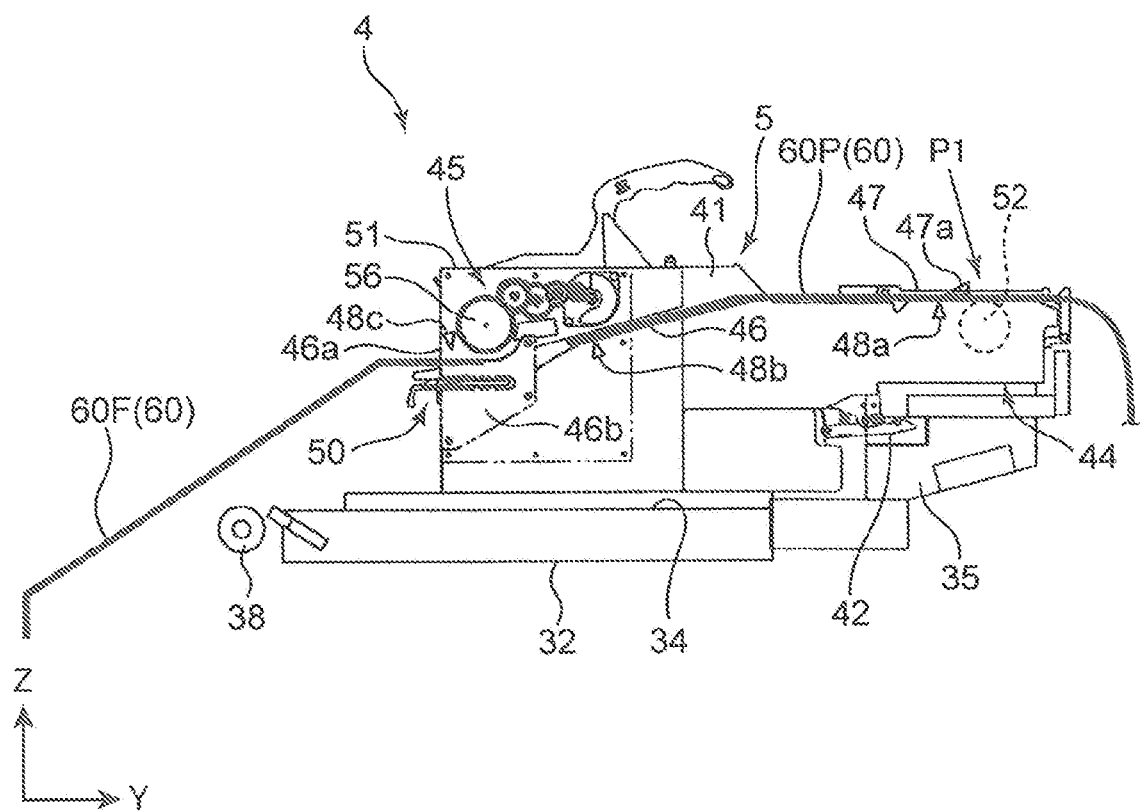
FIG. 10 is a diagram showing one state of the component supply tape in a tape transportation path.

That is, the tape 60 installed in the tape feeder 5 includes a tape having an area in which no component is housed in the tape rear end part (empty tape area 61) as shown in FIG. 9A, and a tape with the component (C1) housed to fill the rear end of the tape 60 as shown in FIG. 9B. Therefore, when the "suction retry over" occurs, as in a case of a conventional component mounting device (component mounting device described in the background art), when it is assumed that only the output information of the second tape detection sensor 48b is taken into consideration and a component shortage of the tape 60 is determined, the following inconvenience can occur For example, for the tape 60 shown in FIG. 9A, if the length of the empty tape area 61 is relatively long, when the "suction retry over" is caused by a component shortage, a state where the rear end part of the tape 60 is detected by the second tape detection sensor 48b may occur as shown in FIG. 10 (this is referred to as a first status). In this case, inconvenience may occur that, although a component shortage has actually occurred, the "suction retry over" is incorrectly detected as a machine trouble.

Figure 11:
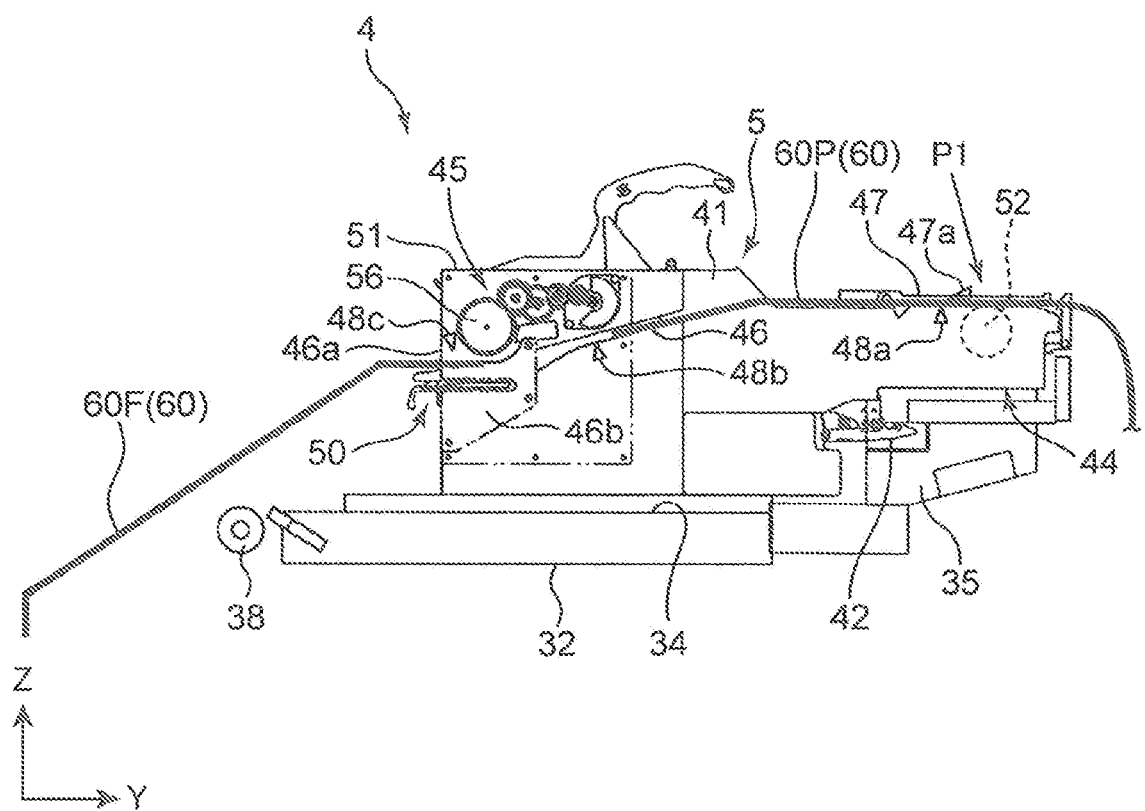
FIG. 11 is a diagram showing one state of the component supply tape in the tape transportation path.

Meanwhile, for the tape 60 shown in FIG. 9B, as shown in FIG. 11, when the "suction retry over" occurs by chance due to a machine trouble in a state where the tape rear end is positioned between the component extraction position P1 and the second tape detection sensor 48b (this is referred to as a second status), since the tape 60 is not detected by the second tape detection sensor 48b, it is determined that a component shortage occurs, and the tape 60 is discharged from the tape feeder 5. In this case, inconvenience may occur that the component housed in the area from the component extraction position P1 to the second tape detection sensor 48b in the tape 60 is discarded uselessly.

However, the component mounting device 1 that determines a component shortage on the basis of the output information from the second tape detection sensor 48b and the component residual quantity eliminates or reduce such inconvenience. That is, even in the case of the first status, if the "sensor priority mode" is set in advance, it is determined whether a component shortage occurs after taking the component residual quantity of the tape 60 into consideration (step S9 of FIG. 8). Therefore, the "suction retry over" is not erroneously detected as a machine trouble. Note that in a case where the "component residual quantity priority mode" is set, when the "suction retry over" occurs, it is immediately determined whether a component shortage occurs by taking the component residual quantity of the tape 60 into consideration (steps S3 and S9 of FIG. 8), leading to a similar result in this case.

Even if the second status occurs, if the "component residual quantity priority mode" has been set, it is always determined whether a component shortage occurs after taking the component residual quantity of the tape 60 into consideration (steps S3 and S9 of FIG. 8). Therefore, it is inhibited that the tape 60 is discharged from the tape feeder 5 and the component is discarded uselessly. Note that if the "sensor priority mode" has been set, it cannot be said that there is no possibility that the component will be discarded when the second status occurs. However, in practice, it is often possible to determine in advance that, when the tape 60 (reel 65) is delivered, the tape 60 is the tape 60 as shown in FIG. 9B. In such a case, by setting the "component residual quantity priority mode" in advance, it is possible to inhibit the component from being discarded uselessly.

Therefore, the component mounting device 1 can detect a component shortage more accurately without being affected by the housing status of the component in the rear end part of the tape 60.

Also, the component mounting device 1 can change the threshold (Nt) for determining whether a component shortage occurs on the basis of the component residual quantity (N) of the tape 60 to an arbitrary value. This enables component shortage determination with higher practicability. That is, it may be uniformly determined that a component shortage occurs when the component residual quantity (N) becomes "0", in other words, the threshold (Nt) may always be set at "0." However, in an actual work site, a component loss or the like caused by the component falling from a tape opening portion can occur during setup. In such a case, an error occurs between the actual component residual quantity of the tape 60 and the component residual quantity stored in the memory unit 72 as component data, making it difficult to accurately determine the component shortage. In this regard, the component mounting device 1 that can change the threshold (Nt) to an arbitrary value can set the threshold (Nt) in consideration of the component loss or the like that occurs in the work site, making it possible to determine a component shortage with higher practicability. Therefore, in this respect, it can be said that the component shortage can be determined more accurately.

[6. Operation Start (Resume) Control of Component Mounting Device 1]

The first tape detection sensor 48a provided in the tape feeder 5 detects whether the tape 60 is present at the component extraction position P1. However, since the front sprocket 52, the driving mechanism therefor, and the cutting mechanism 47a for the cover tape 64 exist at the component extraction position P1, the first tape detection sensor 48a is offset slightly backward of the actual position of the component extraction position P1.

Figure 12:
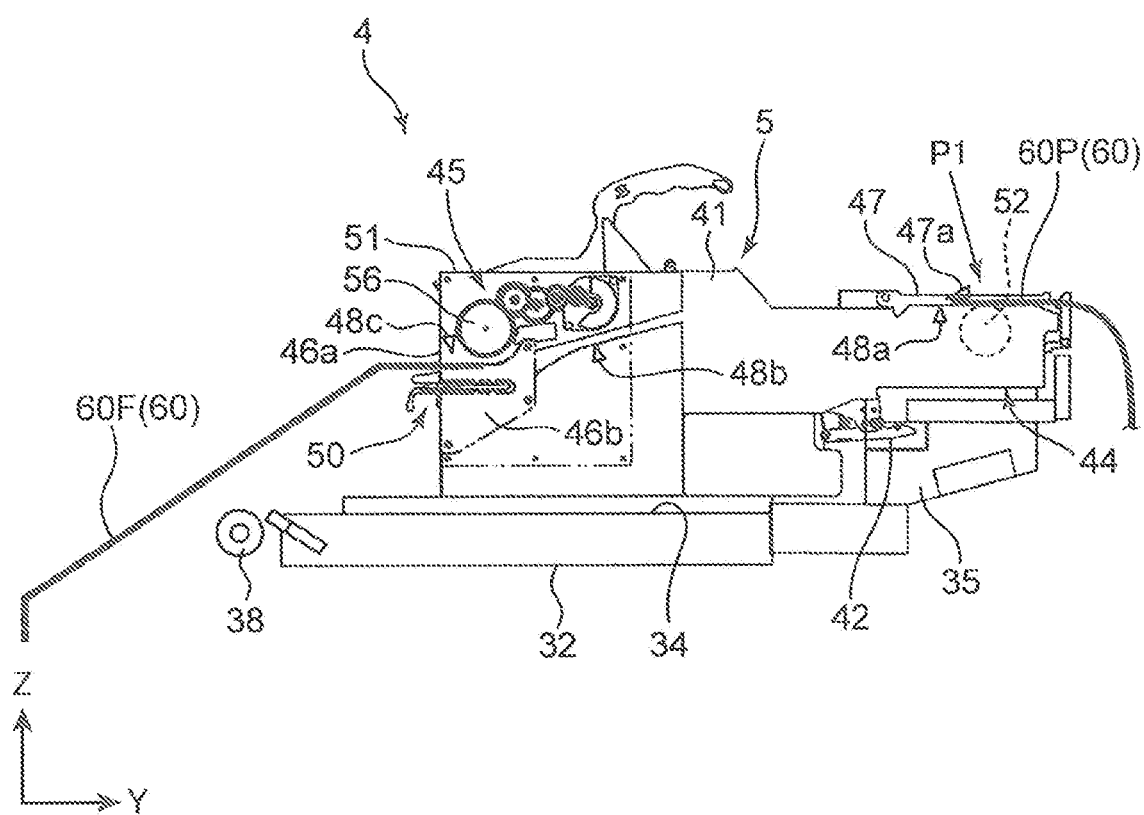
FIG. 12 is a diagram showing one state of the component supply tape in the tape transportation path.

Therefore, the following inconvenience may occur in the tape feeder 5 when the operation is interrupted by an error or the like of the component mounting device 1. For example, as shown in FIG. 12, if the automatic operation of the component mounting device 1 is interrupted in a state where the rear end of the preceding tape 60P is positioned between the component extraction position P1 and the first tape detection sensor 48a and then the operation is resumed (operation start button is turned on), the preceding tape 60P is not detected by the first tape detection sensor 48a, and therefore the succeeding tape 60F is loaded. As a result, the preceding tape 60P is discharged from the tape feeder 5, and the component housed in the area between the component extraction position P1 and the tape rear end of the preceding tape 60P is uselessly discarded.

In order to avoid such inconvenience, the component mounting device 1 further has the following configuration.

When the preceding tape 60P is set in the tape feeder 5 and then the first component supply by the preceding tape 60P is executed, that is, when the component is sucked by the head 20, the arithmetic processing unit 71 sets a flag for recognizing the preceding tape as one item of the component data stored in the memory unit 72. This flag is maintained until 1) the preceding tape 60P is discharged from the tape feeder 5 due to a component shortage, 2) the operation of the operation unit 51 causes the preceding tape 60P to perform reverse transmission and to be removed from the tape feeder 5 before a component shortage occurs, 3) the tape feeder 5 itself is removed from the feeder attachment unit 32.

Figure 13:
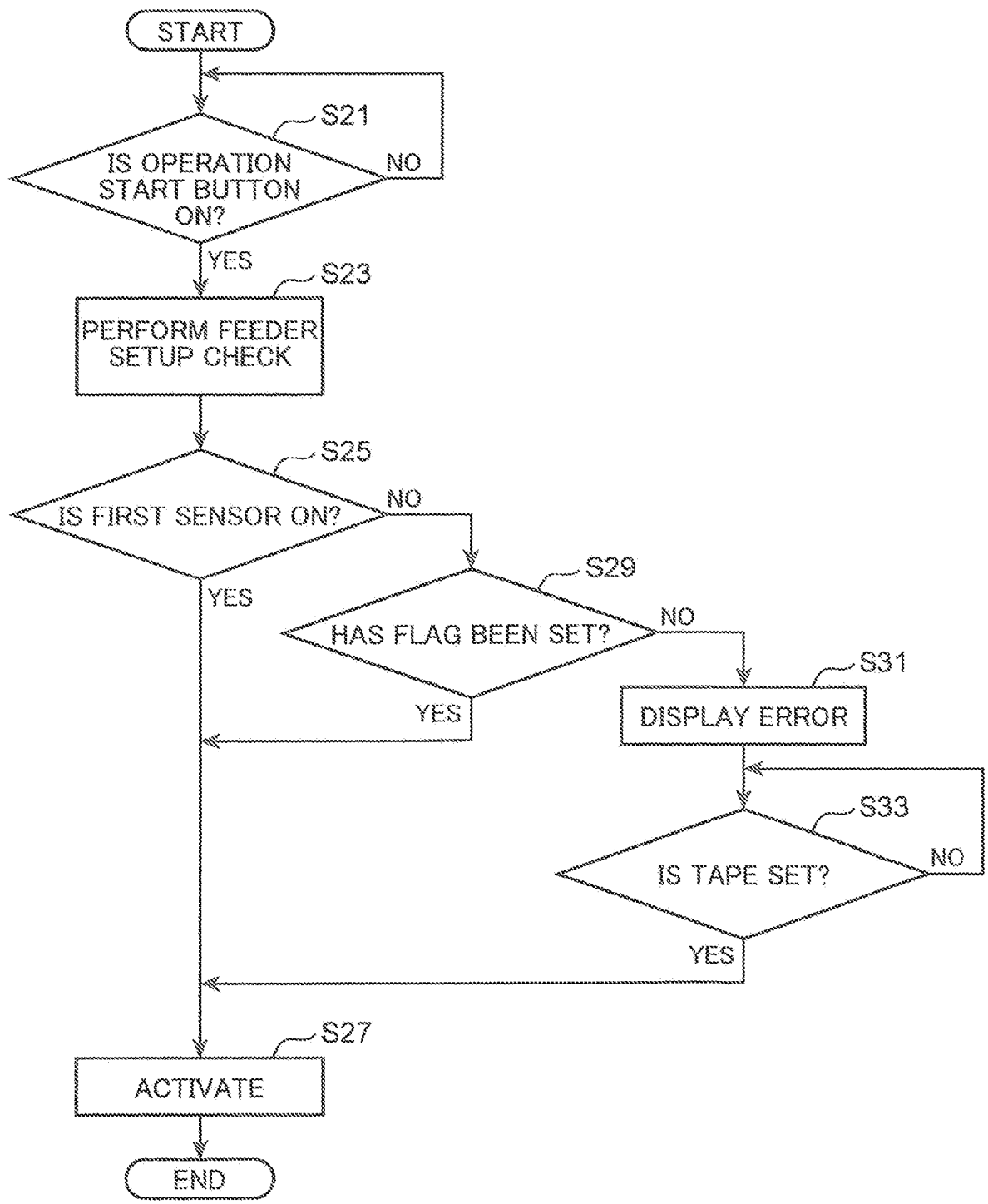
FIG. 13 is a flowchart showing operation start control of the component mounting device.

Also, the arithmetic processing unit 71 executes the operation start (resume) control of the component mounting device 1 as described below. FIG. 13 is a flowchart showing the operation start control.

After the interruption of the automatic operation of the component mounting device 1, the arithmetic processing unit 71 waits for the operation start button (not shown) to be turned on (Yes in step S21), and performs setup check processing when the operation start button is turned on (step S23). The setup check processing refers to processing for confirming whether the predetermined tape feeder 5 (component) has been set in the predetermined slot 34 of the feeder attachment unit 32.

When the setup check processing is performed, the arithmetic processing unit 71 determines whether the first tape detection sensor 48a of the tape feeder 5 is on, that is, whether the preceding tape 60P is detected by the first tape detection sensor 48a (step S25). Then, when Yes here, the arithmetic processing unit 71 resumes the operation of the component mounting device 1 (step S27).

On the other hand, when No in step S25, the arithmetic processing unit 71 determines whether the flag has been set for the preceding tape 60P installed in the tape feeder 5 (step S29). When Yes here, the arithmetic processing unit 71 shifts the process to step S27 and resumes the operation of the component mounting device 1. That is, when the first tape detection sensor 48a does not detect the preceding tape 60P but the flag is set for the preceding tape 60P, as shown in FIG. 12, the operation of the component mounting device 1 has been resumed in a state where the rear end of the preceding tape 60P is positioned between the component extraction position P1 and the first tape detection sensor 48a. Therefore, the arithmetic processing unit 71 resumes the operation of the component mounting device 1 while ignoring the output information from the first tape detection sensor 48a. This will start the component mounting operation.

On the other hand, when No in step S29, the arithmetic processing unit 71 performs error display processing by controlling the display device 81, and activates the warning light 83 (step S31). That is, the case where the preceding tape 60P is not detected by the first tape detection sensor 48a and the flag is not set for the preceding tape 60P refers to a state where the preceding tape 60P does not exist at the component extraction position P1. Therefore, in this case, an error is displayed as a component shortage to urge the operator to set the tape 60 in the tape feeder 5. Then, when the tape 60 is set in the tape feeder 5 (Yes step S33), that is, when the tape 60 is detected by the first tape detection sensor 48a, the arithmetic processing unit 71 shifts the process to step S27 and resumes the operation of the component mounting device 1.

Although not shown in the flowchart, when No in step S29, the arithmetic processing unit 71 determines whether the succeeding tape 60F has been set in the upper path 46a on the basis of the output information from the third tape detection sensor 48c. When the succeeding tape 60F has been set in the upper path 46a, the arithmetic processing unit 71 drives the rear sprocket 56 to load the component supply tape 60 at the component extraction position P1. Therefore, the operation of the component mounting device 1 is resumed without going through the processing of steps S31 and S33. That is, when it is determined No in the processing of step S29, the arithmetic processing unit 71 performs the error display processing of step S31 only when the succeeding tape 60F has not been set in the upper path 46a.

Note that for convenience of description, the processing of steps S25 and S29 to S33 in FIG. 13 shows the processing for one tape feeder 5. Actually, however, the arithmetic processing unit 71 performs the processing of steps S25 and S29 to S33 for all the tape feeders 5 set in the feeder attachment unit 32.

With the above-described configuration, even if the operation of the component mounting device 1 is resumed in a state where the rear end of the preceding tape 60P is positioned between the component extraction position P1 and the first tape detection sensor 48a, discarding the preceding tape 60P after the operation is resumed is prevented. Therefore, it is possible to inhibit the component from being discarded uselessly.

Note that in the example of this section, the first tape detection sensor 48a of the tape feeder 5 corresponds to "sensor" of the present disclosure, the arithmetic processing unit 71 further corresponds to "flag setting unit" of the present disclosure, and the memory unit 72 corresponds to "memory unit" of the present disclosure.

Although not mentioned in the above description, for example, if the flag setting is canceled when the power of the component mounting device 1 is turned off, when the power of the component mounting device 1 is turned off in a state where the rear end of the preceding tape 60P is positioned between the component extraction position P1 and the first tape detection sensor 48a and then the power is turned on, if the preceding tape 60P is not detected by the first tape detection sensor 48a, the preceding tape 60P is discharged from the tape feeder 5 and the component is discarded uselessly. Therefore, it is more preferable to store the flag setting in the memory unit that is not affected by power-off, for example, a nonvolatile memory or the like.

[7. Modification]

The component mounting device 1 to which the present disclosure is applied has been described above. The specific configuration of the present disclosure is not limited to the configuration of the embodiment described above, and can be appropriately changed without departing from the spirit of the present disclosure. For example, the following configuration is also applicable.

(1) In the above-described embodiment, it is possible to select and set one of two modes, "sensor priority mode" and "component residual quantity priority mode", as the condition for the component shortage determination. However, the condition (mode) for the component shortage determination may be fixedly set to either mode.

(2) In the above-described embodiment, the component supply unit 4 is a fixed type integrally (non-detachably) incorporated into the component mounting device 1. However, the component supply unit 4 may be a hand cart type unit that is detachably united to the device main body of the component mounting device 1. Specifically, the component supply unit 4 may include the feeder attachment unit 32, the fixing table 35, the reel support unit 36, the guide roller 38, and the like installed on a frame member including a plurality of casters. In this case, the component supply unit 4 and the control device 70 are electrically connected via a connector. Note that in the component mounting device 1 having such a configuration, in the activation control described above, the arithmetic processing unit 71 is only required to cancel the flag setting when the component supply unit 4 is detached from the device main body and the mutual electrical connection state is canceled.

(3) In the operation start control of the component mounting device 1 of the embodiment, the flag is set as information that allows identification of the tape transportation status when the operation of the component mounting device 1 is interrupted. However, the information is not limited to the flag. For example, a result of success or failure of component suction in each tape feeder 5 (referred to as component suction success failure information) may be stored in the memory unit 72, and the component suction success failure information may be applied as the information that allows identification of the tape transportation status. That is, if the component suction immediately before the interruption of the operation of the component mounting device 1 is successful, it can be estimated that the tape 60 is present at the component extraction position P1 Even if the component suction is failure, in this case, it is highly likely that a component shortage occurs. Therefore, even if the tape 60 is not recognized and is discharged from the tape feeder 5 after the operation of the component mounting device 1 is resumed, the component is not wasted. Therefore, even with such a configuration, it is possible to enjoy the operational effects similar to the effects of the operation start control described above.

(4) As shown in FIG. 3, the tape feeder 5 of the embodiment exposes the component C1 to the outside by cutting the cover tape 64 at the center of the width direction along the longitudinal direction. However, the tape feeder 5 may be configured such that while one end of the width direction of the cover tape 64 is peeled off along the longitudinal direction, the cover tape 64 is folded back to the other end of the width direction. Also, the tape feeder 5 may be a type of winding up the cover tape 64 while peeling off the cover tape 64 from the tape body 62. As the tape feeder 5, various types can be applied.

(5) In the above-described embodiment, the bar code 66 is provided on the reel 65 as a recording part in which various information items such as ID of the component are recorded. However, the recording part is not limited to the bar code 66, and may be another two-dimensional code such as a QR code (registered trademark), an IC chip, or the like. Therefore, the reading device is not limited to the bar code reader 84 as long as the reading device can read information in the recording part.

The present disclosure is summarized as follows on the basis of the embodiment described above.

The present disclosure is a component shortage detection device for detecting a component shortage of a tape feeder installed in a component mounting device. The component shortage detection device includes: a sensor provided at a position that is a midpoint of a tape transportation path of the tape feeder and upstream of a component extraction position by a component mounting head in a tape transportation direction, the sensor being configured to detect the tape; a residual quantity calculation unit configured to calculate a component residual quantity of the tape during a mounting operation; and a determination unit configured to determine whether the component shortage occurs on a basis of output information from the sensor and the component residual quantity when the head fails in extraction of the component.

The component shortage detection device determines whether the component shortage occurs on the basis of the component residual quantity in addition to the tape detection information. Therefore, the component shortage detection device can determine the component shortage while being less affected by the component housing status in the tape rear end part than in a case where whether the component shortage occurs is determined on the basis of only the output information from the sensor. This makes it possible to more accurately detect the component shortage.

More specifically, the determination unit determines presence of the tape on a basis of the output information from the sensor, determines that the component shortage occurs when the tape is not present, and determines whether the component shortage occurs on a basis of the component residual quantity when the tape is present.

With this configuration, even if it is determined that the tape is present on the basis of the output information from the sensor, for example, when the component residual quantity is small (for example, "0"), it is finally determined that the component shortage occurs. Therefore, particularly when the tape has a relatively long empty tape area in the rear end, it is possible to more appropriately detect the component shortage. That is, it is inhibited that occurrence of a machine trouble is erroneously recognized because the tape is detected by the sensor although there is actually a component shortage.

In this case, when the component residual quantity is equal to or less than a preset threshold, the determination unit preferably determines that the component shortage occurs. Note that the threshold may be "0" or another value.

That is, in the actual work site, it may be difficult to accurately manage the component residual quantity of the tape because setting up the tape in the tape feeder involves a component loss. With this configuration, it is possible to more appropriately determine the component shortage by setting in advance the threshold that takes into account variable elements of the number of components such as a component loss during setup.

Note that the component shortage detection device further includes a first setting unit configured to set to which of the output information from the sensor and the component residual quantity priority is given when the determination unit determines whether the component shortage occurs. When it is set to give priority to the output information from the sensor, the determination unit determines presence of the tape on a basis of the output information from the sensor, determines that the component shortage occurs when the tape is not present, and determines whether the component shortage occurs on a basis of the component residual quantity when the tape is present.

With this configuration, it is possible for the operator to arbitrarily set whether to determine the component shortage by giving priority to the output information from the sensor according to various conditions such as reliability of the component residual quantity in the tape, or to determine the component shortage by giving priority to the component residual quantity.

In particular, when giving priority to the output information from the sensor, even if it is determined that the tape is present on the basis of the output information from the sensor, for example, when the component residual quantity is small (for example, "0"), it is finally determined that the component shortage occurs. Therefore, when the tape has a relatively long empty tape area in the rear end, it is possible to detect the component shortage more appropriately. That is, it is inhibited that occurrence of a machine trouble is erroneously recognized because the tape is detected by the sensor although there is actually a component shortage.

Note that in this configuration, when it is set to give priority to information regarding the component residual quantity, the determination unit preferably determines that the component shortage occurs when the component residual quantity is equal to or less than a preset threshold. Note that the threshold may be "0" or another value.

That is, in the actual work site, it may be difficult to accurately manage the component residual quantity of the tape because setting up the tape in the tape feeder involves a component loss. With this configuration, it is possible to more appropriately determine the component shortage by setting in advance the threshold that takes into account variable elements of the number of components such as a component loss during setup.

The component shortage detection device preferably includes a second setting unit configured to change a value of the threshold when the determination unit is configured to determine the component shortage by comparing the component residual quantity with the threshold.

With this configuration, it is possible to set the threshold at an arbitrary value in consideration of the specific number of component losses such as when setting up the tape in the tape feeder. Therefore, it is possible to make the determination of the component shortage more practical.

Note that preferably the component shortage detection device further includes a memory unit configured to store information that allows identification of a tape transportation status in the tape transportation path when the component mounting device undergoes operation stop when at least one of interruption of the operation of the component mounting device and turning off of power of the component mounting device is defined as the operation stop of the component mounting device, wherein when the operation of the component mounting device is resumed after the operation stop, the determination unit determines the presence of the tape in the tape transportation path on a basis of the information that allows identification of the tape transportation status when the operation stops in addition to the output information from the sensor.

For example, if the operation of the component mounting device is stopped in a state where the tape rear end is positioned between the component extraction position by the head and the sensor, and then the operation is resumed, there is a possibility that, after the operation is resumed, the tape may not be recognized, and the tape may be discharged from the tape feeder and the remaining component may be wasted. However, with the above-described configuration, after the operation of the component mounting device is resumed, it is determined whether the tape is present in the tape transportation path on the basis of the information that allows identification of the tape transportation status when the operation is stopped in addition to the output information from the sensor. Therefore, inconvenience as described above is inhibited.

In this case, for example, the component shortage detection device further includes a flag setting unit configured to set a flag when first component supply with the tape is performed after the tape is installed in the tape feeder. The memory unit stores a flag setting status about the tape feeder as the information that allows identification of the tape transportation status, and when the operation of the component mounting device is resumed after the operation stop, the determination unit takes the flag setting status stored in the memory unit into consideration, and always determines that the tape is present in the tape transportation path when the flag is set.

With this configuration, it is possible to enjoy the above-described operational effects by a simple method of setting the flag.

The invention claimed is:

1. A component shortage detection device for detecting a component shortage of a splicing-less tape feeder installed in a component mounting device, the component shortage detection device comprising:
   a sensor provided at a position that is a midpoint of a tape transportation path of the tape feeder and upstream of a component extraction position by a component mounting head in a tape transportation direction, the sensor being configured to detect the tape; and a control device including a computer comprising
a residual quantity calculator configured to calculate a component residual quantity of the tape during a mounting operation; and
a determination processor configured to determine whether the component shortage occurs on a basis of output information from the sensor and the component residual quantity when the head fails in extraction of the component;
wherein the determination processor is configured to determine a presence of the tape based on the output information from the sensor, determine that the component shortage occurs when the tape is not present, and determine whether the component shortage occurs based on the component residual quantity when the tape is present.

2. The component shortage detection device according to claim 1, wherein
when the component residual quantity is equal to or less than a preset threshold, the determination processor determines that the component shortage occurs.

3. The component shortage detection device according to claim 2, further comprising
an input device operatively connected to the control device and including a second setting unit configured to change a value of the threshold.

4. The component shortage detection device according to claim 3, further comprising
a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device,
wherein when the operation of the component mounting device is resumed after the operation stop, the determination processor determines the presence of the tape in the tape transportation path on a basis of the information that allows identification of the tape transportation status when the operation stops in addition to the output information from the sensor.

5. The component shortage detection device according to claim 1, further comprising
a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device,
wherein when the operation of the component mounting device is resumed after the operation stop, the determination processor determines the presence of the tape in the tape transportation path on a basis of the information that allows identification of the tape transportation status when the operation stops in addition to the output information from the sensor.

6. The component shortage detection device according to claim 4, further comprising
a flag setting processor configured to set a flag when first component supply with the tape is performed after the tape is installed in the tape feeder,
wherein
the memory is configured to store a flag setting status about the tape feeder as the information that allows identification of the tape transportation status, and
when the operation of the component mounting device is resumed after the operation stop, the determination processor takes the flag setting status stored in the memory into consideration, and always determines that the tape is present in the tape transportation path when the flag is set.

7. The component shortage detection device according to claim 5, further comprising
a flag setting processor configured to set a flag when first component supply with the tape is performed after the tape is installed in the tape feeder,
wherein
the memory is configured to store a flag setting status about the tape feeder as the information that allows identification of the tape transportation status, and
when the operation of the component mounting device is resumed after the operation stop, the determination processor takes the flag setting status stored in the memory unit into consideration, and always determines that the tape is present in the tape transportation path when the flag is set.

8. The component shortage detection device according to claim 2, further comprising
a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device,
wherein when the operation of the component mounting device is resumed after the operation stop, the determination processor determines the presence of the tape in the tape transportation path on a basis of the information that allows identification of the tape transportation status when the operation stops in addition to the output information from the sensor.

9. The component shortage detection device according to claim 8, further comprising
a flag setting processor configured to set a flag when first component supply with the tape is performed after the tape is installed in the tape feeder,
wherein
the memory is configured to store a flag setting status about the tape feeder as the information that allows identification of the tape transportation status, and
when the operation of the component mounting device is resumed after the operation stop, the determination processor takes the flag setting status stored in the memory into consideration, and always determines that the tape is present in the tape transportation path when the flag is set.

10. A component shortage detection device for detecting a component shortage of a splicing-less tape feeder installed in a component mounting device, the component shortage detection device comprising:
a sensor provided at a position that is a midpoint of a tape transportation path of the tape feeder and upstream of a component extraction position by a component mounting head in a tape transportation direction, the sensor being configured to detect the tape;

a control device including a computer comprising
a residual quantity calculator configured to calculate a component residual quantity of the tape during a mounting operation; and
a determination processor configured to determine whether the component shortage occurs based on output information from the sensor and the component residual quantity when the head fails in extraction of the component; and
an input device operatively connected to the control device and including a first setting unit configured to set to which of the output information from the sensor and the component residual quantity priority is given when the determination processor determines whether the component shortage occurs,
wherein when the first setting unit is set to give priority to the output information from the sensor, the determination processor determines presence of the tape based on the output information from the sensor, determines that the component shortage occurs when the tape is not present, and determines whether the component shortage occurs based on the component residual quantity when the tape is present.

11. The component shortage detection device according to claim 10, wherein
when the first setting unit is set to give priority to information regarding the component residual quantity, the determination processor determines that the component shortage occurs when the component residual quantity is equal to or less than a preset threshold.

12. The component shortage detection device according to claim 11,
wherein the input device includes a second setting unit configured to change a value of the threshold.

13. The component shortage detection device according to claim 10, further comprising
a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device,
wherein when the operation of the component mounting device is resumed after the operation stop, the determination processor determines the presence of the tape in the tape transportation path on a basis of the information that allows identification of the tape transportation status when the operation stops in addition to the output information from the sensor.

14. The component shortage detection device according to claim 11, further comprising
a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device,
wherein when the operation of the component mounting device is resumed after the operation stop, the determination processor determines the presence of the tape in the tape transportation path on a basis of the information that allows identification of the tape transportation status when the operation stops in addition to the output information from the sensor.

15. The component shortage detection device according to claim 12, further comprising
a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device,
wherein when the operation of the component mounting device is resumed after the operation stop, the determination processor determines the presence of the tape in the tape transportation path on a basis of the information that allows identification of the tape transportation status when the operation stops in addition to the output information from the sensor.

16. The component shortage detection device according to claim 13, further comprising
a flag setting processor configured to set a flag when first component supply with the tape is performed after the tape is installed in the tape feeder,
wherein
the memory is configured to store a flag setting status about the tape feeder as the information that allows identification of the tape transportation status, and
when the operation of the component mounting device is resumed after the operation stop, the determination processor takes the flag setting status stored in the memory into consideration, and always determines that the tape is present in the tape transportation path when the flag is set.

17. The component shortage detection device according to claim 14, further comprising
a flag setting processor configured to set a flag when first component supply with the tape is performed after the tape is installed in the tape feeder,
wherein
the memory is configured to store a flag setting status about the tape feeder as the information that allows identification of the tape transportation status, and
when the operation of the component mounting device is resumed after the operation stop, the determination processor takes the flag setting status stored in the memory into consideration, and always determines that the tape is present in the tape transportation path when the flag is set.

18. A component shortage detection device for detecting a component shortage of a tape feeder installed in a component mounting device, the component shortage detection device comprising:
a sensor provided at a position that is a midpoint of a tape transportation path of the tape feeder and upstream of a component extraction position by a component mounting head in a tape transportation direction, the sensor being configured to detect the tape;
a control device including a computer comprising
a residual quantity calculator configured to calculate a component residual quantity of the tape during a mounting operation;
a determination processor configured to determine whether the component shortage occurs on a basis of output information from the sensor and the component residual quantity when the head fails in extraction of the component;

a memory configured to store information that allows identification of a tape transportation status in the tape transportation path when the component mounting device undergoes operation stop when at least one of interruption of the operation of the component mounting device and turning off of power of the component mounting device is defined as the operation stop of the component mounting device; and a flag setting processor configured to set a flag when first component supply with the tape is performed after the tape is installed in the tape feeder, wherein the memory is configured to store a flag setting status about the tape feeder as the information that allows identification of the tape transportation status, and when the operation of the component mounting device is resumed after the operation stop, the determination processor takes the flag setting status stored in the memory into consideration, and always determines that the tape is present in the tape transportation path when the flag is set.

* * * * *